United States Patent
Kamata et al.

(10) Patent No.: US 10,186,402 B2
(45) Date of Patent: Jan. 22, 2019

(54) MEASUREMENT SYSTEM AND MEASUREMENT METHOD

(71) Applicant: TOKYO ELECTRON LIMITED, Tokyo (JP)

(72) Inventors: Koji Kamata, Miyagi (JP); Hiroshi Ikari, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 43 days.

(21) Appl. No.: 14/941,925

(22) Filed: Nov. 16, 2015

(65) Prior Publication Data

US 2016/0141154 A1    May 19, 2016

(30) Foreign Application Priority Data

Nov. 19, 2014  (JP) .................. 2014-234724

(51) Int. Cl.
*H01J 37/32* (2006.01)
*G01B 7/06* (2006.01)
*G01B 7/02* (2006.01)

(52) U.S. Cl.
CPC ........ *H01J 37/32935* (2013.01); *G01B 7/023* (2013.01); *G01B 7/08* (2013.01);
(Continued)

(58) Field of Classification Search
CPC ........ H03K 17/955; G01B 7/08; G01B 7/023; G01B 7/003; B65H 2220/03
(Continued)

(56) References Cited

U.S. PATENT DOCUMENTS 5,194,743 A *  3/1993  Aoyama ............. G03F 7/70716
                                                    250/548
6,368,450 B2 *  4/2002  Hayashi ............. H01L 21/68721
                                                    118/723 E
(Continued)

FOREIGN PATENT DOCUMENTS

JP       2006-173223 A     6/2006
JP       2006-196716 A     7/2006
(Continued)

*Primary Examiner* — Patrick Assouad
*Assistant Examiner* — Christopher McAndrew
(74) *Attorney, Agent, or Firm* — Rothwell, Figg, Ernst & Manbeck, P.C.

(57) ABSTRACT

A measurement system for measuring a consumption amount of a focus ring in a plasma etching apparatus including a processing chamber, a lower electrode and the focus ring surrounding a periphery of the lower electrode, comprises a sensor substrate having a distance sensor and a measurement unit configured to measure a consumption amount of the focus ring. The measurement unit includes a transfer instruction unit, an acquisition unit and a measurement unit. The transfer instruction unit is configured to instruct a transfer unit to transfer the sensor substrate into the processing chamber. The acquisition unit is configured to acquire information on a physical amount corresponding to a distance from the distance sensor to the focus ring, which is measured by the distance sensor. The measurement unit is configured to measure a consumption amount of the focus ring based on the acquired information on the physical amount.

11 Claims, 10 Drawing Sheets

(52) U.S. Cl.
CPC .... *H01J 37/3299* (2013.01); *H01J 37/32642* (2013.01); *H01J 37/32917* (2013.01)

(58) Field of Classification Search
USPC .......................................................... 324/671
See application file for complete search history.

(56) References Cited

U.S. PATENT DOCUMENTS

| | | | | |
|---|---|---|---|---|
| 7,477,960 B2* | 1/2009 | Willis | ................ | G05B 19/4184 |
| | | | | 700/110 |
| 8,632,637 B2* | 1/2014 | Nishio | .............. | H01J 37/32082 |
| | | | | 134/1 |
| 2006/0157698 A1* | 7/2006 | Miyajima | ......... | H01L 21/67288 |
| | | | | 257/48 |
| 2006/0171848 A1* | 8/2006 | Roche | ................ | G01R 31/2642 |
| | | | | 422/98 |
| 2008/0066868 A1* | 3/2008 | Masuda | ............ | H01J 37/32623 |
| | | | | 156/345.51 |
| 2010/0025369 A1 | 2/2010 | Negishi et al. | | |
| 2010/0141274 A1* | 6/2010 | Keller | ................. | B29C 47/0026 |
| | | | | 324/671 |
| 2011/0048643 A1* | 3/2011 | Endoh | ............... | H01J 37/32642 |
| | | | | 156/345.41 |
| 2011/0235056 A1* | 9/2011 | Matsudo | ................ | G01B 11/06 |
| | | | | 356/630 |
| 2013/0008609 A1* | 1/2013 | Koshimizu | ....... | H01J 37/32091 |
| | | | | 156/345.51 |
| 2013/0284375 A1* | 10/2013 | Nagayama | .......... | C23C 16/0227 |
| | | | | 156/345.51 |

FOREIGN PATENT DOCUMENTS

| | | |
|---|---|---|
| JP | 2009-54665 A | 3/2009 |
| JP | 2010-34416 A | 2/2010 |

* cited by examiner

MEASUREMENT SYSTEM AND MEASUREMENT METHOD

CROSS-REFERENCE TO RELATED APPLICATIONS

This application claims priority to Japanese Patent Application No. 2014-234724 filed on Nov. 19, 2014, the entire contents of which are incorporated herein by reference.

FIELD OF THE INVENTION

The disclosure relates to a measurement system and a measurement method.

BACKGROUND OF THE INVENTION

In a plasma etching apparatus, uniformity of plasma distribution near a peripheral portion of a target substrate is improved by providing a focus ring around a lower electrode on which the target substrate is mounted. However, the focus ring is gradually etched together with the target substrate during an etching process using a plasma. If the focus ring is etched, the uniformity of the plasma distribution at the peripheral portion of the target substrate is decreased. Therefore, an etching rate is changed at the peripheral portion of the target substrate and this may result in deterioration of device characteristics.

In order to measure a consumption amount of the focus ring, a thickness of the focus ring is measured by using a Vernier Caliper or the like in the state that the inside of a processing chamber of a plasma etching apparatus exposed to an atmospheric atmosphere, whenever a predetermined number of plasma etching processes is completed, for example. However, once exposed to an atmospheric atmosphere, the inside of the processing chamber needs to return to a vacuum state in order to continue the processing, which requires a time.

When the Vernier Caliper or the like is brought into contact with an inner part of the processing chamber in order to measure the thickness of the focus ring, a by-product that has been adhered to the inner part of the processing chamber may be peeled off. The by-product may adhere as a contaminant to the target substrate when the plasma etching process is performed again. In order to protect the target substrate from the contamination, it is required to perform cleaning or measure the amount of particles after the thickness of the focus ring is measured. Therefore, in the case of measuring the thickness of the focus ring, a production line is stopped during such a process and this results in decrease of a productivity.

In order to suppress the decrease of the productivity of the production line, there is required a technique for measuring the amount of the focus ring without exposing the inside of the processing chamber to the atmospheric atmosphere. As the example of such a technique, there is known, e.g., a method for irradiating laser beam to the focus ring to measure the amount of the focus ring based on an angle of a reflection light therefrom or the like (see, e.g. Japanese Patent Application Publication Nos. 2006-173223 and 2010-34416).

However, in the method for measuring the consumption amount of the focus ring based on the angle of the reflection light or the like, it is required to provide a window for introducing laser beam into the processing chamber of the plasma etching apparatus and a window for guiding the reflection light out of the processing chamber. In order to install those windows, the plasma etching apparatus needs to be modified, which increases a manufacturing cost of the plasma etching apparatus. In addition, a degree of freedom in design of the plasma etching apparatus is decreased because it is not possible to provide a member on optical paths of the laser beam and the reflection light.

SUMMARY OF THE INVENTION

In accordance with an aspect of the present invention, there is provided a measurement system for measuring a consumption amount of a focus ring in a plasma etching apparatus including a processing chamber configured to accommodate a target substrate, a lower electrode provided in the processing chamber and configured to mount thereon the target substrate loaded into the processing chamber by a transfer unit, and the focus ring surrounding a periphery of the lower electrode, the measurement system including: a sensor substrate having a distance sensor; and a measurement unit configured to measure a consumption amount of the focus ring, wherein the measurement unit includes: a transfer instruction unit configured to instruct the transfer unit to transfer the sensor substrate into the processing chamber;

an acquisition unit configured to acquire information on a physical amount corresponding to a distance from the distance sensor to the focus ring, which is measured by the distance sensor; and a measurement unit configured to measure a consumption amount of the focus ring based on the acquired information on the physical amount.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
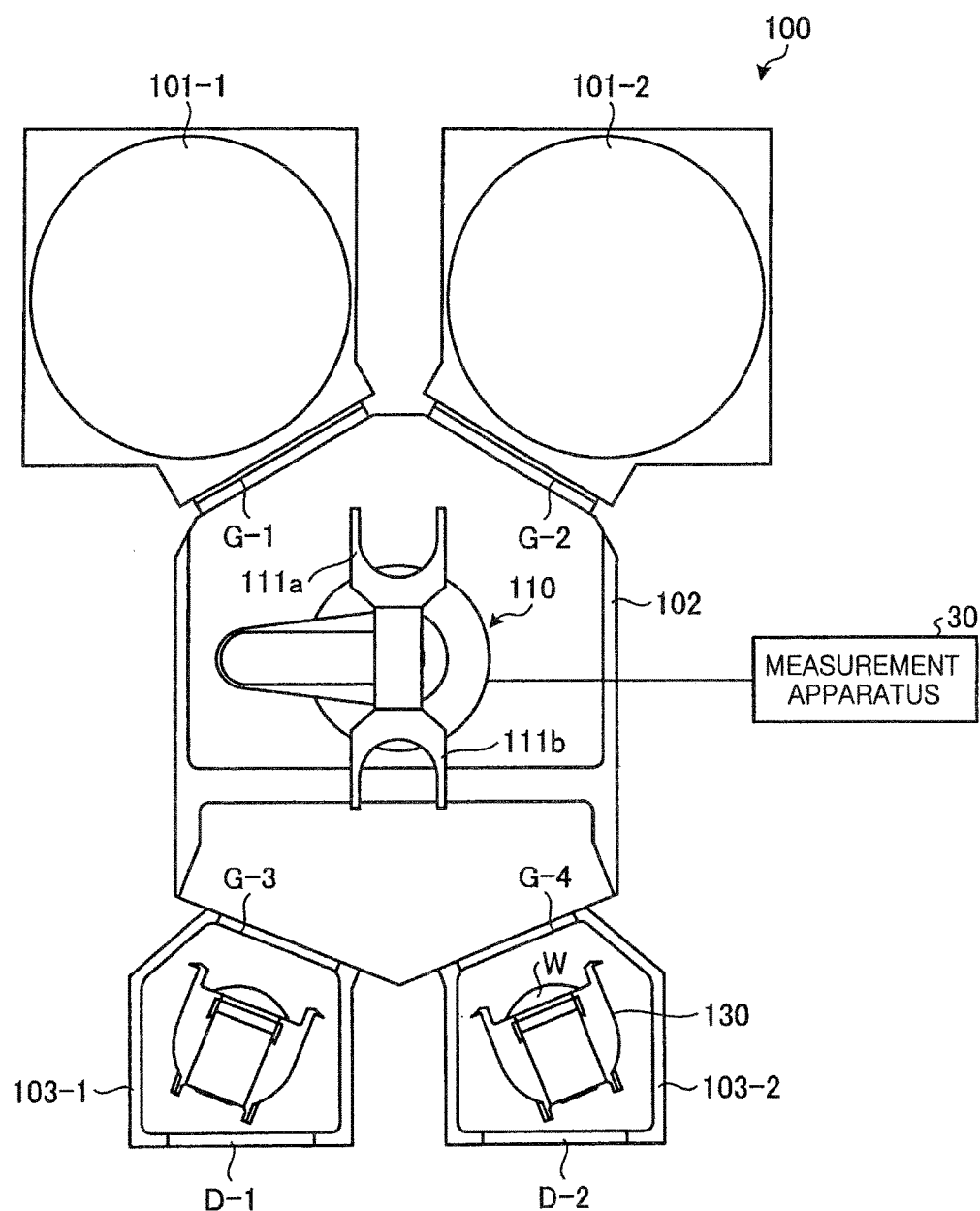
FIG. 1 shows an example of a processing system according to an embodiment.

A measurement system for measuring a consumption amount of a focus ring in a plasma etching apparatus including a processing chamber configured to accommodate a target substrate, a lower electrode provided in the processing chamber and configured to mount thereon the target substrate loaded into the processing chamber by a transfer unit, and the focus ring surrounding a periphery of the lower electrode, the measurement system includes: a sensor substrate having a distance sensor; and a measurement unit configured to measure a consumption amount of the focus ring, wherein the measurement unit includes: a transfer instruction unit configured to instruct the transfer unit to transfer the sensor substrate into the processing chamber; an acquisition unit configured to acquire information on a physical amount corresponding to a distance from the distance sensor to the focus ring, which is measured by the distance sensor; and a measurement unit configured to measure a consumption amount of the focus ring based on the acquired information on the physical amount.

Further, in accordance with an embodiment of the present disclosure, the distance sensor may measure the information on the physical amount corresponding to the distance from the distance sensor to the focus ring at a plurality of portions in a width direction of the focus ring while passing through a space above the focus ring.

Further, in accordance with an embodiment of the present disclosure, the transfer instruction unit may load the sensor substrate to a position which is further from a gate through which the target substrate is loaded into the processing chamber than a position where the target substrate is mounted on the lower electrode, and the distance sensor may measure the information on the physical amount corresponding to the distance from the distance sensor to the focus ring at least at a portion of the focus ring which is close to the gate from a center of the focus ring and at a portion of the focus ring which is opposite to the gate from the center of the focus ring.

Further, in accordance with an embodiment of the present disclosure, when the transfer unit loads the sensor substrate into the processing chamber, the transfer instruction unit may instruct the transfer unit to hold the sensor substrate such that the distance sensor is located at a position on the sensor substrate which is separated by a predetermined distance from a straight line passing through a center of the sensor substrate and indicating a transfer direction of the sensor substrate.

Further, in accordance with an embodiment of the present disclosure, the sensor substrate may have a positioning portion that is an orientation flat or a notch, and the distance sensor may be located at a position on the sensor substrate which is separated from by a predetermined distance a straight line passing through the center of the sensor substrate and the positioning portion.

Further, in accordance with an embodiment of the present disclosure, the distance sensor may be an electrostatic capacitance sensor and measure an electrostatic capacitance as the physical amount corresponding to the distance from the distance sensor to the focus ring.

Further, in accordance with an embodiment of the present disclosure, the sensor substrate may include a wireless communication device configured to wirelessly transmit the information on the physical amount which is measured by the distance sensor, and the acquisition unit may acquire the information on the physical amount which is wirelessly transmitted by the wireless communication device.

Further, in accordance with an embodiment of the present disclosure, a measurement method for measuring a consumption amount of a focus ring in a plasma etching apparatus including a processing chamber configured to accommodate a target substrate, a lower electrode provided in the processing chamber and configured to mount thereon the target substrate loaded into the processing chamber by a transfer unit, and the focus ring surrounding a periphery of the lower electrode, the measurement method including: transferring a sensor substrate having a distance sensor into the processing chamber; acquiring information on a physical amount corresponding to a distance from the distance sensor to the focus ring, which is measured by the distance sensor; and measuring a consumption amount of the focus ring based on the acquired information on the physical amount.

Hereinafter, embodiments of a measurement system and a measurement method will be described in detail with reference to the accompanying drawings. The disclosure is not limited to those embodiments. The embodiments may be optimally combined within the scope that does not contradict the processing content.

(Configuration of Processing System 100)

FIG. 1 shows an example of the processing system 100 according to an embodiment. The processing system 100 includes a plurality of plasma etching apparatuses 101 (101-1 and 101-2), a transfer chamber 102, and a plurality of cassette chambers 103 (103-1 and 103-2). The plasma etching apparatuses 101 and the cassette chambers 103 are provided around the transfer chamber 102. The processing system 100 is an example of a measurement system.

A gate valve G-1 is provided between the plasma etching apparatus 101-1 and the transfer chamber 102. The gate valve G-1 can airtightly seal or allow communication between the plasma etching apparatus 101-1 and the transfer chamber 102. In the same manner, a gate valve G-2 is provided between the plasma etching apparatus 101-2 and the transfer chamber 102. The gate valve G-2 can airtightly seal or allow communication between the plasma etching apparatus 101-2 and the transfer chamber 102.

Further, a gate valve G-3 is provided between the cassette chamber 103-1 and the transfer chamber 102. The gate valve G-3 can airtightly seal or allow communication between the cassette chamber 103-1 and the transfer chamber 102. In the same manner, a gate valve G-4 is provided between the cassette chamber 103-2 and the transfer chamber 102. The gate valve G-4 can airtightly seal or allow communication between the cassette chamber 103-2 and the transfer chamber 102.

A door valve D-1 is provided at the cassette chamber 103-1. The door valve D-1 can airtightly seal the inside of the cassette chamber 103-1 from the outside of the cassette chamber 103-1 or expose the cassette chamber 103-1 to an atmospheric atmosphere by allowing communication between the inside and the outside of the cassette chamber 103-1. In the same manner, a door valve D-2 is installed at the cassette chamber 103-2. The door valve D-2 can airtightly seal the inside of the cassette chamber 103-2 from the outside of the cassette chamber 103-2 or expose the cassette chamber 103-2 to an atmospheric atmosphere by allowing communication between the inside and the outside of the cassette chamber 103-2.

Cassettes 130 accommodating therein a plurality of semiconductor wafers W as target substrates are loaded into the cassette chambers 103-1 and 103-2 through the door valves D-1 and D-2, respectively. The cassettes 130 accommodating therein semiconductor wafers W that have been processed in the plasma etching apparatus 101-1 and 101-2 can be unloaded from the cassette chambers 103-1 and 103-2 through the door valves D-1 and D-2, respectively. Each of the cassettes 130 also accommodates a sensor substrate 20 to be described later. A vacuum exhaust unit (not shown) is provided at each of the cassette chambers 103. After the cassettes 130 are loaded and the door valves D-1 and D-2 are closed, the inside of each cassette chamber 103 is exhausted to a predetermined vacuum level by the vacuum exhaust unit.

A transfer unit 110 having a multi-joint arm is provided inside the transfer chamber 102. The multi-joint arm has, at a leading end thereof, substrate supporting portions 111a and 111b for holding the semiconductor wafer W. The transfer unit 110 can allow the substrate supporting portions 111 to enter the plasma etching apparatuses 101 and the cassette chambers 103 in a state where the gate valves G-1 to G-4 are opened.

Further, the substrate supporting portion 111 of the transfer unit 110 holds an unprocessed semiconductor wafer W to transfer the same from the cassette 130 in the cassette chamber 101 into the plasma etching apparatus 101. Then, the substrate supporting portion 111 of the transfer unit 110 holds the processed semiconductor wafer W to transfer the same from the plasma etching apparatus 101 into the cassette 130 in the cassette chamber 103. The transfer unit 110 can transfer the semiconductor wafer W in a state where the inside of the transfer chamber 102 is exhausted to a predetermined vacuum level by a vacuum exhaust unit (not shown) provided in the transfer chamber 102.

A measurement apparatus 30 is connected to the transfer unit 110 in the transfer chamber 102. The measurement apparatus 30 instructs the transfer unit 110 to transfer the sensor substrate 20 from the cassette 130 into the plasma etching apparatus 101. Then, the measurement apparatus 30 measures a state of a component, e.g., a focus ring, in the plasma etching apparatus 101 based on information measured by the sensor substrate 20 that has been loaded into the plasma etching apparatus 101.

Figure 2:
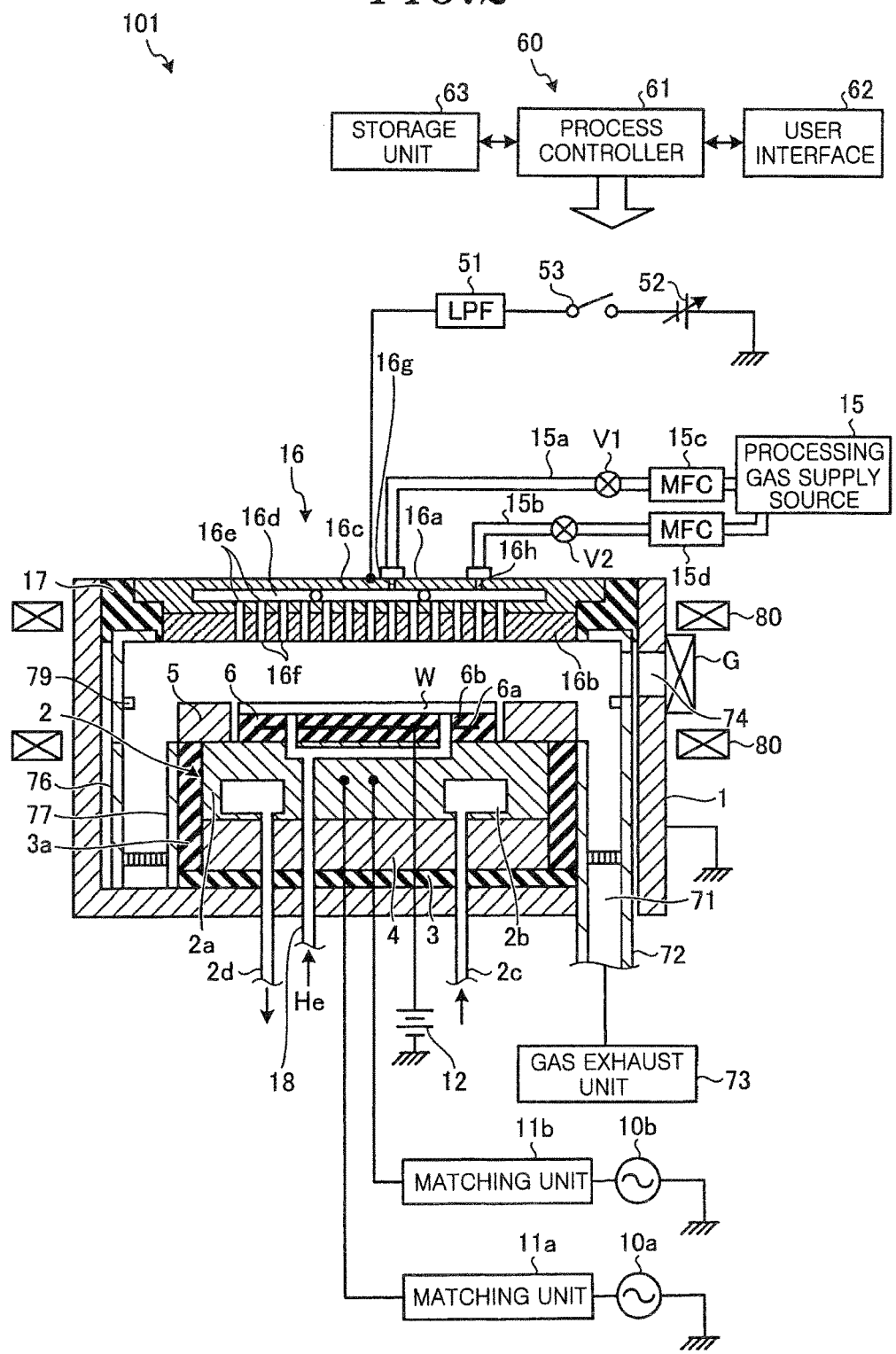
FIG. 2 is a schematic cross sectional view showing an example of a plasma etching apparatus.

FIG. 2 is a schematic cross sectional view showing an example of the plasma etching apparatus 101. As shown in FIG. 2, the plasma etching apparatus 101 includes an airtight processing chamber 1 that is electrically grounded. The processing chamber 1 has a substantially cylindrical shape and is made of, e.g., aluminum having an anodically oxidized surface. Provided in the processing chamber 1 is a mounting table 2 for horizontally supporting the semiconductor wafer W as a target substrate.

The mounting table 2 has a base 2a made of a conductive metal, e.g., aluminum or the like. The mounting table 2 serves as a lower electrode. The mounting table 2 is supported by a conductive supporting table 4. An insulating plate 3 is provided below the supporting table 4. A focus ring 5 made of, e.g., single crystalline silicon or the like, is provided on an outer periphery of the mounting table 2. A cylindrical inner wall member 3a made of, e.g., quartz or the like, is provided to surround the mounting table 2 and the supporting table 4.

A shower head 16 serving as an upper electrode is provided above the mounting table 2 to face the mounting table 2 approximately in parallel. In other words, the shower head 16 is provided to face the semiconductor wafer W mounted on the mounting table 2. The shower head 16 and the mounting table 2 serve as a pair of electrodes (upper electrode and lower electrode). A high frequency power supply 10a is connected to the base 2a of the mounting table 2 via a matching unit 11a. Further, a high frequency power supply 10b is connected to the base 2a of the mounting table 2 via a matching unit 11b. A high frequency power of a predetermined frequency (e.g., about 100 MHz) for plasma generation is supplied from the high frequency power supply 10a to the base 2a of the mounting table 2. Further, a high frequency power of a predetermined frequency (e.g., about 13 MHz) for ion attraction (bias) which is lower than that from the high frequency power supply 10a is supplied from a high frequency power supply 10b to the base 2a of the mounting table 2.

An electrostatic chuck 6 for electrostatically attracting and holding the semiconductor wafer W is provided on the top surface of the mounting table 2. The electrostatic chuck 6 includes an insulator 6b and an electrode 6a embedded therein. A DC power supply 12 is connected to the electrode 6a. The semiconductor wafer W is attracted and held on the electrostatic chuck 6 by a Coulomb force generated on the surface of the electrostatic chuck 6 by a DC voltage applied from the DC power supply 12.

A flow path 2b through which a coolant flows is formed in the mounting table 2. Conduits 2c and 2d are connected to the flow path 2b. By circulating a coolant such as Galden or the like through the flow path 2b, the supporting table 2 and the mounting table 2 can be controlled to a predetermined temperature. A conduit 18 for supplying a coolant gas (backside gas) such as helium gas or the like to the backside of the semiconductor wafer W is formed through the mounting table 2. The conduit 18 is connected to a backside gas supply source (not shown). With such a configuration, the semiconductor wafer W attracted and held on the mounting table 2 by the electrostatic chuck 6 can be controlled to a predetermined temperature.

The shower head 16 is provided at an upper portion of the processing chamber 1. The shower head 16 includes a main body 16a and an upper ceiling plate 16b serving as an electrode plate. The shower head 16 is supported at the upper portion of the processing chamber 1 through an insulating member 17. The main body 16a is made of an anodically oxidized aluminum or the like. The upper ceiling plate 16b is detachably held at a bottom portion of the main body 16a. The upper ceiling plate 16b is made of, e.g., a silicon-containing material such as quartz or the like.

Gas diffusion spaces 16c and 16d are formed in the main body 16a. A plurality of gas through holes 16e is formed at the bottom portion of the main body 16a to be positioned below the gas diffusion spaces 16c and 16d. The gas diffusion space is divided into the gas diffusion space 16c formed at a central portion and the gas diffusion space 16d formed at a peripheral portion. Therefore, the supply state of the processing gas can be controlled separately at the central portion and the peripheral portion.

Gas injection holes 16f are formed through the upper ceiling plate 16b in a thickness direction thereof. The gas injection holes 16f communicate with the gas through holes 16e, respectively. With such a configuration, the processing gas supplied to the gas diffusion spaces 16c and 16d is supplied in a shower form into the processing chamber 1 through the gas through holes 16e and the gas injection holes 16f. A temperature controller such as a heater (not shown), a conduit (not shown) for circulating a coolant, or the like is installed at the main body 16a. Accordingly, the shower head 16 can be controlled to a desired temperature range during the plasma etching process.

Two gas inlet ports 16g and 16g for introducing the processing gas into the gas diffusion spaces 16c and 16d, respectively, are formed at the main body 16a. One end of the conduit 15a is connected to the gas inlet port 16g and the other end of the conduit 15a is connected to a processing gas supply source 15 for supplying an etching gas via a valve V1 and a mass flow controller (MFC) 15C. One end of the conduit 15b is connected to the gas inlet port 16h and the other end of the conduit 15b is connected to the processing gas supply source 15 via a valve V2 and an MFC 15d.

The processing gas supplied from the processing gas supply source 15 is supplied to the gas diffusion spaces 16c and 16d through the conduits 15a and 15b, respectively. Then, the processing gas is supplied in a shower form to the processing chamber 1 through the gas through holes 16e and the gas injection holes 16f.

A variable DC power supply 52 is electrically connected to the shower head 16b serving as the upper electrode via a low pass filter (LPF) 51. The variable DC power supply 52 can start or stop DC power supply by using a switch 53. A current and a voltage of the variable DC power supply 52 and an ON/OFF operation of the switch 53 are controlled by a control unit 60 to be described later. As will be described later, when a plasma is generated in a processing space by supplying high frequency powers from the high frequency power supplies 10a and 10b to the mounting table 2, the switch 53 is turned ON by the control unit 60, if necessary, and a predetermined DC voltage is applied to the shower head 16 serving as the upper electrode.

A gas exhaust port 71 is provided at a bottom portion of the processing chamber 1. A gas exhaust unit 73 is connected to the gas exhaust port 71 through a gas exhaust conduit 72. The gas exhaust unit 73 includes a vacuum pump. By operating the vacuum pump, the inside of the processing chamber 1 can be depressurized to a predetermined vacuum level. An opening 74 is formed at a sidewall of the processing chamber 1. A gate valve 75 for opening and closing the opening 74 is provided at the opening 74.

Deposition shields 76 and 77 are detachably provided along the inner wall of the processing chamber 1. The deposition shields 76 and 77 have a function of preventing etching by-product (deposits) from adhering to the inner wall of the processing chamber 1. The deposition shield 77 covers the mounting table 2 serving as the lower electrode, the inner wall member 3a and the outer peripheral surface of the supporting table 4. A conductive member (GND block) 79 that is DC-connected to the ground is provided at the deposition shield 76 at the substantially same height as the semiconductor wafer W attracted and held on the electrostatic chuck 6. The conductive member 79 prevents abnormal discharge from occurring in the processing chamber 1.

Ring magnets 80 are concentrically provided around the processing chamber 1. The ring magnets 80 generate a magnetic field in the space between the shower head 16 and the mounting table 2. The ring magnets 80 are rotatable by a rotation unit (not shown).

The overall operation of the plasma etching apparatus 101 configured as described above is controlled by the control unit 60. The control unit 60 includes a process controller 61 having a CPU (central processing unit) and configured to control respective components of the plasma etching apparatus 101, a user interface 62, and a storage unit 63. The user interface 62 includes a keyboard through which a process manager inputs a command to operate the plasma etching apparatus 101, a display for visualizing and displaying an operation state of the plasma etching apparatus 101, and the like.

The storage unit 63 stores therein recipes including control programs (software) for executing various processes performed in the plasma etching apparatus 101 under the control of the process controller 61, processing condition data and the like. In response to an instruction from the user interface 62 or the like, a certain recipe is retrieved from the storage unit 63 and executed by the process controller 61. Accordingly, a desired process is performed in the plasma etching apparatus 101 under the control of the process controller 61. The recipes including the control programs and the processing condition data can be read out from a computer-readable storage medium (e.g., a hard disk, a CD, a flexible disk, a semiconductor memory, and the like), or can be transmitted from another device via, e.g., a dedicated line.

(Configuration of Sensor Substrate 20)

Figure 3:
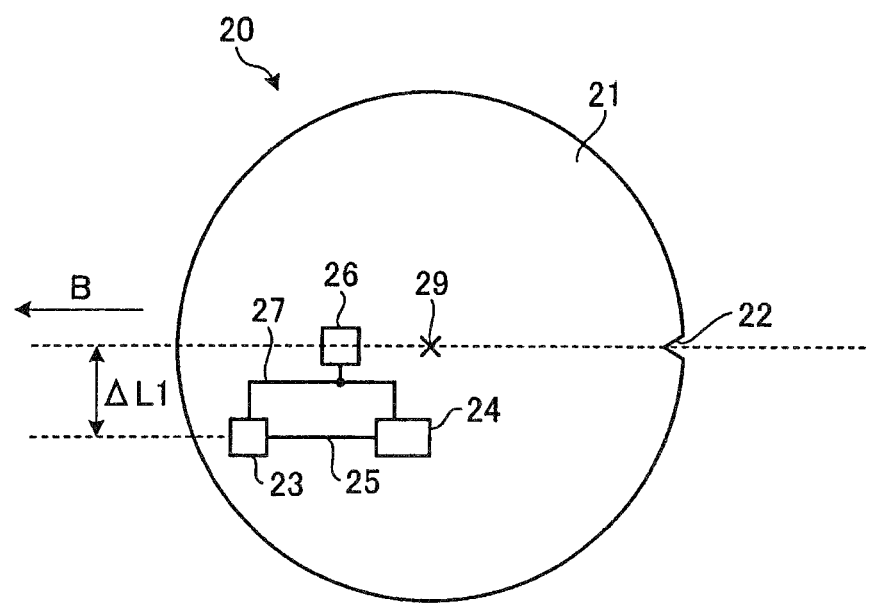
FIG. 3 shows an example of a sensor substrate.

FIG. 3 shows an example of the sensor substrate 20. As shown in FIG. 3, the sensor substrate 20 includes a base substrate 21, a distance sensor 23, a wireless communication device 24 and a battery 26. In the present embodiment, the base substrate 21 has substantially the same shape as that of the semiconductor wafer W as a target substrate. Accordingly, the sensor substrate 20 can be handled in the same manner as the semiconductor wafer W by the substrate supporting portions 111 of the transfer unit 110. A positioning portion 22 indicating a direction of the base substrate 21 is formed at an outer periphery of the base substrate 21. In the present embodiment, the positioning portion 22 is, e.g., a notch. The positioning portion 22 may be an orientation flat.

The distance sensor 23, the wireless communication device 24 and the battery 26 are installed on the surface of the base substrate 21. The battery 26 is connected to the distance sensor 23 and the wireless communication device 24 via a wiring 27 and supplies power to the distance sensor 23 and the wireless communication device 24 through the wiring 27. The distance sensor 23 is connected to the wireless communication device 24 via a wiring 25. The distance sensor 23 is located at a portion on the base substrate 21 which is separated by a distance of $\Delta L1$ from a straight line passing through a center 29 of the base substrate 21 and the positioning portion 22.

The wireless communication device 24 receives a radio wave transmitted wirelessly from the measurement apparatus 30, demodulates the received radio wave, and transmits the demodulated radio wave to the distance sensor 23 through the wiring 25. When a signal is received from the distance sensor 23 through the wiring 25, the wireless communication device 24 performs predetermined modulation on the signal and wirelessly transmits the modulated signal to the measurement apparatus 30. In the present embodiment, the signal is transmitted and received between the wireless communication device 24 and the measurement apparatus 30 by an analog wireless communication method. It is also possible to transmit and receive the signal between the wireless communication device 24 and the measurement apparatus 30 by a digital wireless communication method such as wireless LAN, Bluetooth (Registered Trademark) or the like.

When receiving a measurement instruction signal from the wireless communication device 24 through the wiring 25, the distance sensor 23 measures a physical amount corresponding to a distance to a measurement target. The distance sensor 23 transmits a signal indicating the measured physical amount to the wireless communication device 24 through the wiring 25. In the present embodiment, the measurement target is the focus ring 5 provided in the processing chamber 1. Further, in the present embodiment, the distance sensor 23 is, e.g., an electrostatic capacitance sensor for measuring an electrostatic capacitance as the physical amount corresponding to the distance to the measurement target. The distance sensor 23 may be another type of sensor (e.g., a laser distance sensor, an ultrasonic sensor or the like) as long as it can measure a physical amount that is changed according to the distance to the measurement target.

When the semiconductor wafer W is processed in the plasma etching apparatus 101, the focus ring 5 is slightly etched by the plasma generated in the processing chamber 1. As the processing of the semiconductor wafer W is repeated, the focus ring 5 becomes thinner and the effect of the focus ring 5 which improves the uniformity of the plasma near the outer periphery of the semiconductor wafer W deteriorates.

Therefore, in the present embodiment, before the plasma etching apparatus 101 starts the processing, the sensor substrate 20 is loaded into the processing chamber 1 and a distance from the distance sensor 23 to the focus ring 5 is measured by the distance sensor 23. After several semiconductor wafers W are processed, the sensor substrate 20 is loaded into the processing chamber 1 and a distance from the sensor substrate 20 to the focus ring 5 is measured by the distance sensor 23. Then, a consumption amount of the focus ring 5 is calculated from the difference between the measured distances before and after the processing. A user of the processing system 100 is notified of the calculated consumption amount.

The semiconductor wafer W as a processing target has the positioning portion 22 as same as that of the sensor substrate 20 shown in FIG. 3. The plasma distribution near the positioning portion 22 formed at the semiconductor wafer W may be different from the plasma distribution at other portions of the outer periphery of the semiconductor wafer W. Therefore, the consumption amount of the focus ring 5 may be different between the portion near the positioning portion 22 and the other portions of the semiconductor wafer W. Accordingly, when the consumption amount of the focus ring 5 is measured near the positioning portion 22 of the semiconductor wafer W, the measurement value may be different from the consumption amount of the focus ring 5 which is measured at the other portions.

In order to prevent this, in the present embodiment, the distance sensor 23 is located at a position on the base substrate 21 to be separated by a distance of $\Delta L1$ from the straight line passing through the center 29 of the base substrate 21 and the positioning portion 22, as can be seen from FIG. 3, for example. When the sensor substrate 20 is loaded into the processing chamber 1 of the plasma etching apparatus 101, the sensor substrate 20 is moved in a direction directed from the positioning portion 22 toward the center 29 of the base substrate 21. Accordingly, when the distance sensor 23 passes through the space above the focus ring 5, the distance sensor 23 passes through a space above a portion different from the portion of the focus ring which is close to the positioning portion 22 of the semiconductor wafer W. As a result, it is possible to prevent the distance sensor 23 from measuring the consumption amount of the focus ring 5 at the portion near the positioning portion 22 of the semiconductor wafer W.

In the present embodiment, when the sensor substrate 20 is moved in a direction B and loaded into the processing chamber 1 through the gate valve G, the sensor substrate 20 is moved to a position further from the gate valve G than the position where the semiconductor wafer W loaded into the processing chamber 1 is mounted on the electrostatic chuck 6. Accordingly, the distance sensor 23 can measure the consumption amount of the focus ring 5 at two portions, i.e., a portion of the focus ring 5 which is close to the gate valve G and a portion of the focus ring 5 which is far from the gate valve G.

At this time, if the distance sensor 23 is located at a position on the base substrate 21 which is too far from the straight line passing through the center 29 of the base substrate 21 and the positioning portion 22, the two portions above the focus ring 5 where the consumption amount is measured by the distance sensor 23 are close to each other in the case of loading the sensor substrate 20 into the processing chamber 1 by moving the sensor substrate 20 in the direction B. Therefore, the difference between the actual consumption amount of the focus ring 5 and the consumption amount of the focus ring 5 which is calculated based on the measurement value of the distance sensor 23 may be increased. Accordingly, it is preferable to provide the distance sensor 23 at a position on the base substrate 21 which is not so far from the straight line passing through the positioning portion 22 and the center 29. The distance $\Delta L1$ from the straight line passing through the center 29 of the base substrate 21 and the positioning portion 22 to the position of the distance sensor 23 on the base substrate 21 is preferably, e.g., about ¼ to ½ of the radius of the base substrate 21. Accordingly, the accuracy of measurement of the consumption amount of the focus ring 5 can be improved.

(Configuration of the Measurement Apparatus 30)

Figure 4:
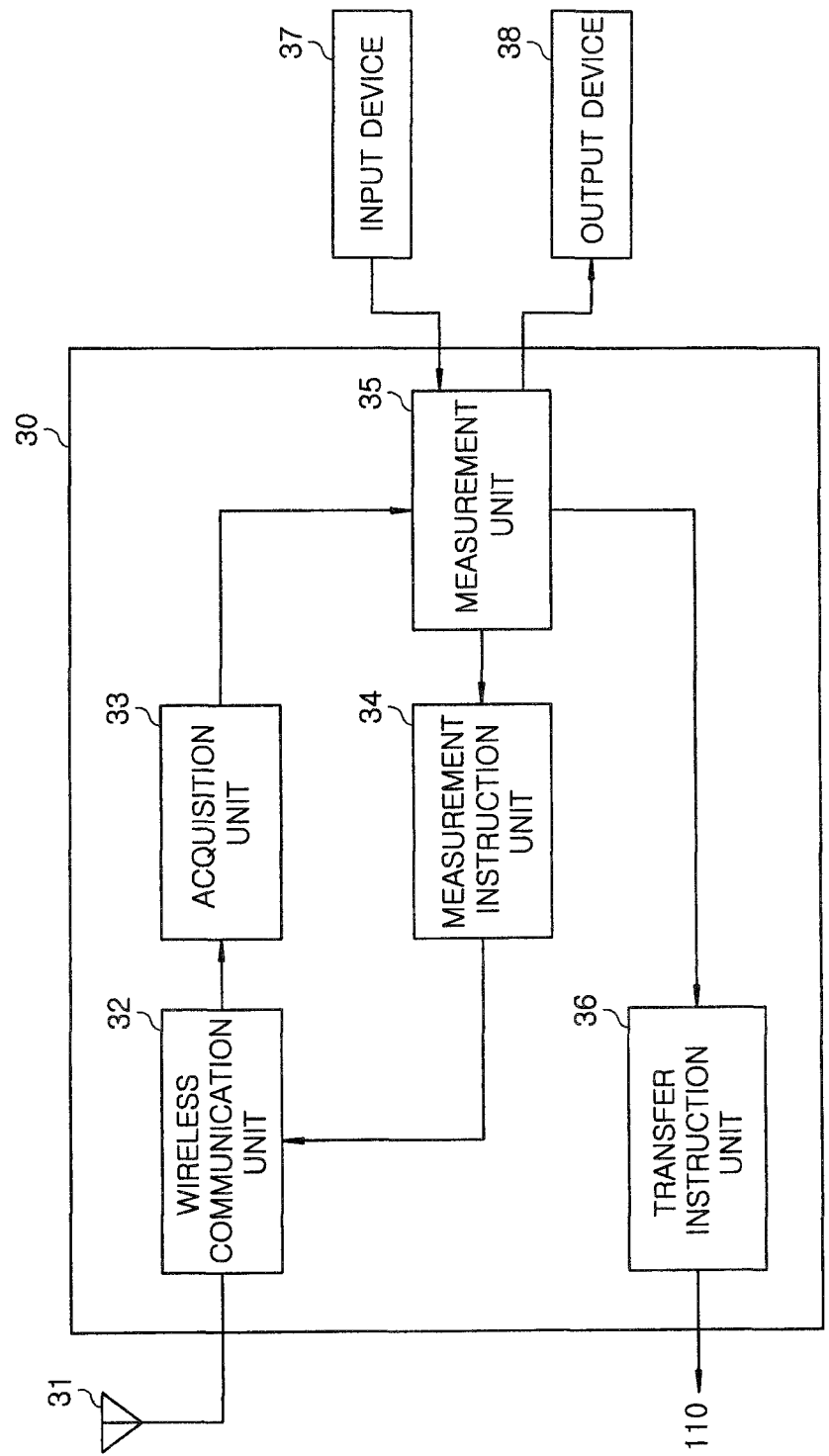
FIG. 4 is a block diagram showing an example of a measurement apparatus.

FIG. 4 is a block diagram showing an example of the measurement apparatus 30. The measurement apparatus 30 includes an antenna 31, a wireless communication unit 32, an acquisition unit 33, a measurement instruction unit 34, a measurement unit 35, and a transfer instruction unit 36, as shown in FIG. 4.

When receiving a signal from the measurement instruction unit 34, the wireless communication unit 32 performs predetermined modulation on the signal and transmits the modulated signal to the sensor substrate 20 via the antenna 31. When receiving the signal from the sensor substrate 20 via the antenna 31, the wireless communication unit 32 modulates the received signal and transmits the modulated signal to the acquisition unit 33.

When receiving a measurement instruction from the measurement unit 35, the measurement instruction unit 34 generates a measurement instruction signal and transmits the generated signal to the wireless communication unit 32. The acquisition unit 33 converts the signal received from the wireless communication unit 32 to information indicating a measurement value and transmits the information to the measurement unit 35. The transfer instruction unit 36 transmits a signal that controls the transfer of the sensor substrate 20 to the transfer unit 110 in response to the instruction from the measurement unit 35.

The measurement unit 35 controls the transfer unit 110 and the distance sensor 23 in response to the instruction from the user of the processing system 100 by using the input device 37 such as a mouse, a keyboard or the like, to measure the state of the components in the processing chamber 1 of the plasma etching apparatus 101. For example, the measurement unit 35 controls the transfer device 110 and the distance sensor 23 in response to the instruction from the user of the processing system 100 to measure the initial state of the focus ring 5 in the processing chamber 1. The initial state is, e.g., a state in which the focus ring 5 has been replaced and is not yet undergone a plasma etching process of the plasma etching apparatus 101.

Figure 5:
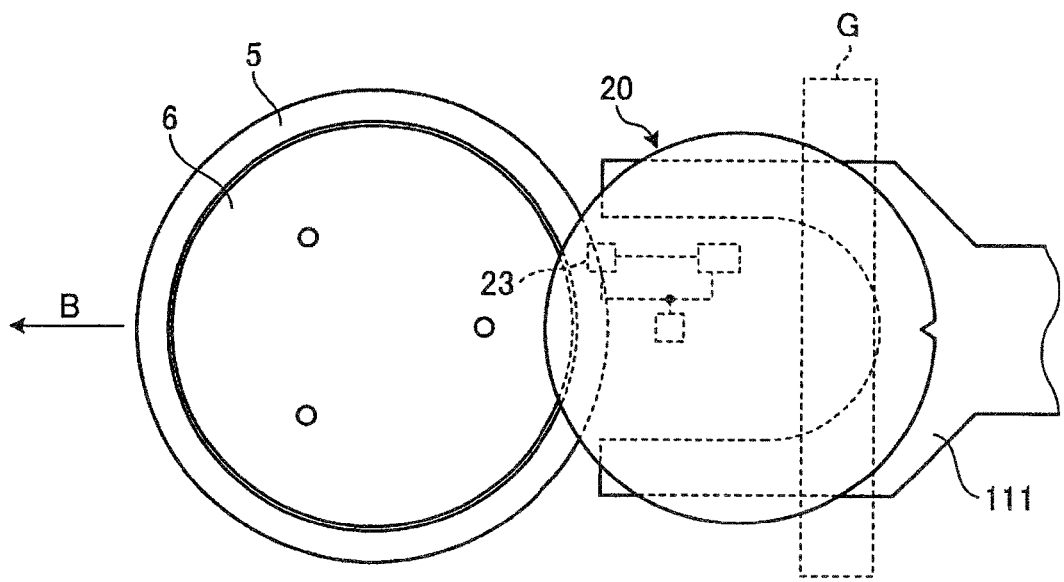
FIGS. 5 to 7 explain examples of a measurement operation.

In order to measure the initial state of the focus ring 5, the measurement unit 35 transmits to the transfer instruction unit 36 an instruction to load the sensor substrate 20 into the processing chamber 1 of the plasma etching apparatus 101 until the sensor substrate 20 reaches a position where the distance sensor 23 is located at a portion above the focus ring 5 which is close to the gate valve G. As shown in FIG. 5, for example, the transfer unit 110 holds the sensor substrate 20 such that the distance sensor 23 is located at a bottom surface of the base substrate 21, and loads the sensor substrate 20 into the processing chamber 1 through the gate valve G along the transfer direction B. When the distance sensor 23 is located at a portion above the focus ring 5 which is close to the gate valve G, the measurement unit 35 transmits a measurement instruction to the measurement instruction unit 34. When receiving a measurement value from the acquisition unit 33, the measurement unit 35 stores distance information corresponding to the received measurement value.

Figure 6:
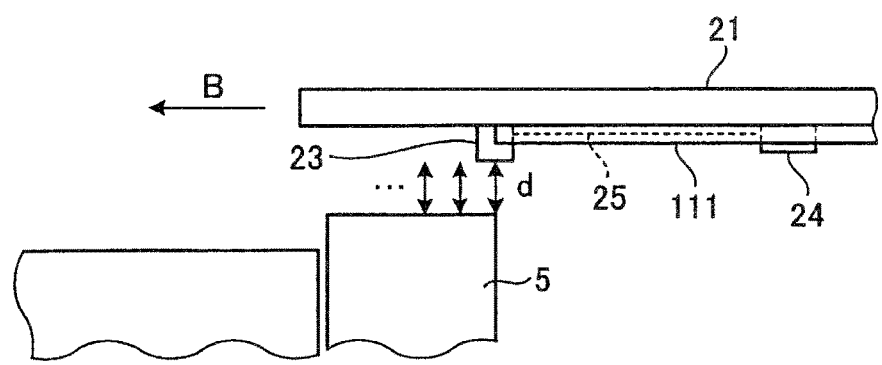

Next, the measurement unit 35 transmits to the transfer instruction unit 36 an instruction to load the sensor substrate 20 into the processing chamber 1 by a predetermined distance. The predetermined distance is, e.g., a few mm. Further, the measurement unit 35 transmits a measurement instruction to the measurement instruction unit 34, receives information on a measurement value from the acquisition unit 33, and stores information on a distance d corresponding to the received measurement value. As shown in FIG. 6, for example, when the distance sensor 23 passes through the space above the focus ring 5, the measurement unit 35 repeats multiple times an operation of moving the sensor substrate 20 by a predetermined distance in the transfer direction B and measuring the distance d to the focus ring 5 (e.g., several tens of times) by using the distance sensor 23.

Figure 7:
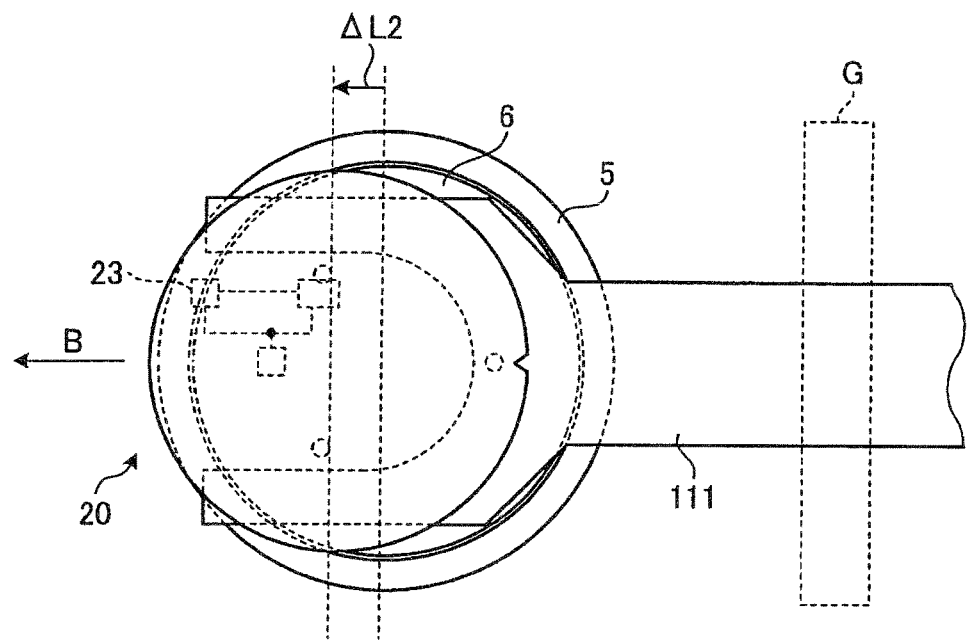

When the distance sensor 23 has passed through the portion above the focus ring 5 which is close to the gate valve G, the measurement unit 35 transmits to the transfer instruction unit 36 an instruction to further load the sensor substrate 20 until the sensor substrate 20 reaches a position where the distance sensor 23 is located at a portion above the focus ring 5 which is far from the gate valve G. As shown in FIG. 7, for example, the sensor substrate 20 is loaded by the transfer unit 110 along the transfer direction B to the position that is further separated by a predetermined distance $\Delta L2$ from the gate valve G compared to the loading position of the semiconductor wafer W as a target substrate. When the distance sensor 23 is located at the portion above the focus ring 5 which is far from the gate valve G as can be seen from FIG. 7, for example, the measurement unit 35 transmits a measurement instruction to the measurement instruction unit 34. When receiving a measurement value from the acquisition unit 33, the measurement unit 35 obtains the information on the distance d corresponding to the received measurement value.

As in the case where the distance sensor 23 is located at the portion above the focus ring 5 which is close to the gate valve G, when the distance sensor 23 passes through the portion above the focus ring 5 which is far from the gate valve G, the measurement unit 35 repeats multiple times an operation of moving the sensor substrate 20 by a predetermined distance into the processing chamber 1 and measuring the distance d to the focus ring 5 by using the distance sensor 23.

Figure 8:
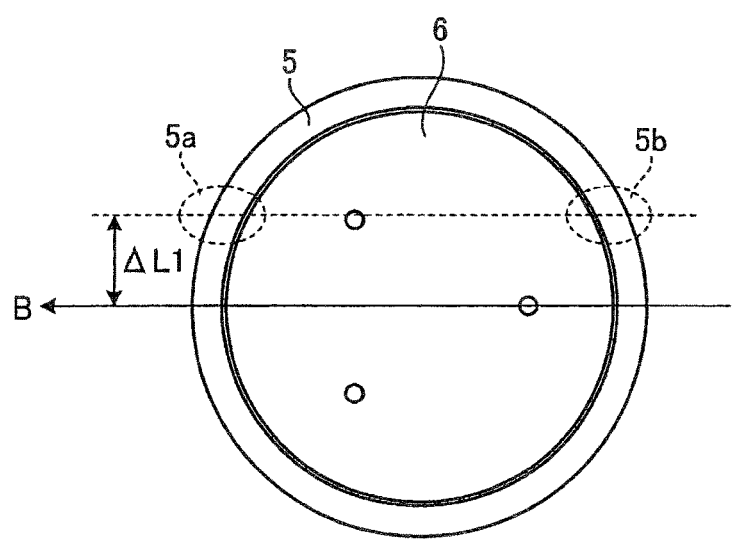
FIG. 8 explains an example of portions of a focus ring of which consumption amount is measured.

In the sensor substrate 20, the distance sensor 23 is located at a position on the base substrate 21 which is separated by a predetermined distance $\Delta L1$ from the straight line passing through the positioning portion 22 and the center of the base substrate 21 as shown in FIG. 3, for example. The transfer unit 110 loads the sensor substrate 20 into the processing chamber 1 along the transfer direction B such that the straight line passing through the center of the base substrate 21 and the positioning portion 22 passes through the substantial center of the focus ring 5 and the electrostatic chuck 6. Accordingly, the distance sensor 23 of the sensor substrate 20 passes through regions 5a and 5b above the focus ring 5 which are separated by the predetermined distance $\Delta L1$ from the straight line passing through the substantial center of the focus ring 5, as can be seen from FIG. 8, for example. As a result, the distance d from the distance sensor 23 to the focus ring 5 in the initial stage is measured multiple times in the region 5a of the focus ring 5 which is far from the gate valve G and the region 5b of the focus ring 5 which is close to the gate valve G.

When the distance sensor 23 has passed through the space above the focus ring 5 which is far from the gate valve G, the measurement unit 35 transmits to the transfer instruction unit 36 an instruction to accommodate the sensor substrate 20 in the cassette 130. The measurement unit 35 calculates a distance $d_0$ from the distance sensor 23 to the focus ring 5 in the initial state based on the distance d measured multiple times at the portion above the focus ring 5 which is close to the gate valve G and the distance d measured multiple times at the portion above the focus ring which is far from the gate valve G. The calculated distance $d_0$ is stored. The measurement unit 35 calculates an average of the distances d corresponding to the measurement values as the distance $d_0$ from the distance sensor 23 to the focus ring 5 in the initial state.

After the plasma etching process is performed one or more times by the plasma etching apparatus 101, the measurement unit 35 controls the transfer unit 110 and the distance sensor 23 in response to an instruction from the user of the processing system 100 to measure the consumption state of the focus ring 5 in the processing chamber 1. For example, when measuring the consumption state of the focus ring 5, as in the case of measuring the initial state of the focus ring 5 as described in FIGS. 5 to 7, the measurement unit 35 measures the distance d from the distance sensor 23 to the focus ring 5 multiple times at the portion above the focus ring 5 which is close to the gate valve G and at the portion above the focus ring 5 which is far from the gate valve G.

The measurement unit 35 calculates a distance $d_1$ from the distance sensor 23 to the focus ring 5 based on the distances d corresponding to the values measured multiple times at the portion above the focus ring 5 which is close to the gate valve G and the distances d corresponding to the values measured at the portion above the focus ring 5 which is far from the gate valve G. The measurement unit 35 calculates, as the consumption amount of the focus ring 5, the value obtained by subtracting the calculated distance $d_1$ from the stored distance $d_0$. The measurement unit 35 outputs the calculated consumption amount of the focus ring 5 to the output device 38 such as a display or the like.

Accordingly, the user of the processing system 100 can measure the consumption amount of the focus ring 5 without exposing the inside of the processing chamber 1 of the plasma etching apparatus 101 to an atmospheric atmosphere. Further, the consumption amount of the focus ring 5 can be measured by using the sensor substrate 20 having the same shape as that of the semiconductor wafer W as a target substrate, so that the consumption amount of the focus ring 5 can be measured by using the conventional plasma etching apparatus 101 without installing a window at a sidewall. In addition, a decrease in a degree of freedom in design of the plasma etching apparatus 101 can be suppressed because it is not necessary to ensure an optical path of the light source which is needed to measure the consumption amount of the focus ring 5.

The measurement unit 35 may count the number of plasma etching processes that have been executed by the plasma etching apparatus 101 and automatically start, when it reaches a predetermined number, the process of measuring the consumption amount of the focus ring 5 without waiting for an instruction from the user of the processing system 100. The number of plasma etching processes that are executed until the process of measuring the consumption amount of the focus ring 5 is started is suitably set by the user of the processing system 100. The measurement unit 35 receives a threshold of the consumption amount from the user of the processing system 100 and stores the threshold. When the consumption amount of the focus ring 5 which is measured in the process of measuring the consumption amount of the focus ring 5 is greater than the threshold, the measurement unit 35 may output the information indicating that the consumption amount of the focus ring 5 has reached the threshold, instead of the measured consumption amount or together with the measured consumption amount, to the output device 38 such as a display or the like.

(Measurement of Initial State)

Figure 9:
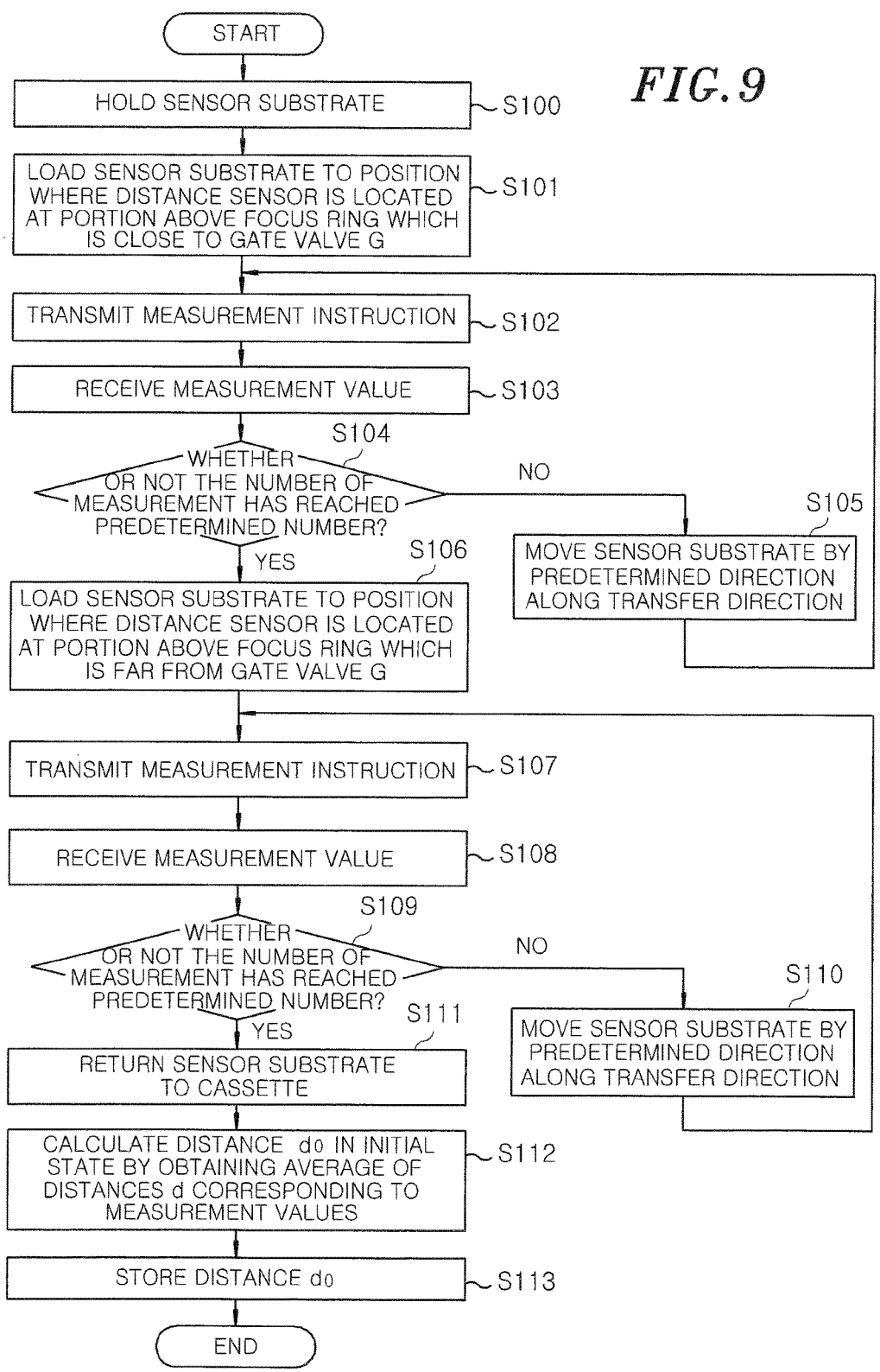
FIG. 9 is a flowchart showing an example of a measuring process in an initial state of the focus ring.

FIG. 9 is a flowchart showing an example of the measurement processing in the initial state of the focus ring 5. For example, when the focus ring 5 is replaced and the user of the processing system 100 instructs the start of the initial state measurement process, the measurement apparatus 30 starts the processes described in the flow chart as shown in FIG. 9.

First, the measurement unit 35 transmits to the transfer instruction unit 36 an instruction of instructing the transfer unit 110 to hold the sensor substrate 20 accommodated in the cassette 130. The transfer instruction unit 36 converts the instruction of the measurement unit 35 to a control signal and transmits the control signal to the transfer unit 110. The transfer unit 110 unloads the sensor substrate 20 from the cassette 130 by using the substrate supporting unit 111 and holds the sensor substrate 20 such that the distance sensor 23 is located at the bottom surface of the base substrate 21 (S100).

Next, the measurement unit 35 transmits to the transfer instruction unit 36 an instruction to load the sensor substrate 20 to the position where the distance sensor is located at the portion above the focus ring 5 which is close to the gate valve G. The transfer instruction unit 36 converts the instruction of the measurement unit 35 to a control signal and transmits the control signal to the transfer unit 110. The transfer unit 110 loads the sensor substrate 20 to a position where the distance sensor is located at the portion above the focus ring 5 which is close to the gate valve G (S101).

Then, the measurement unit 35 transmits a measurement instruction (S102). Specifically, the measurement unit 35 transmits the measurement instruction to the measurement instruction unit 34. The measurement instruction unit 34 generates a signal indicating a measurement instruction and transmits the generated signal to the wireless communication unit 32. The wireless communication unit 32 performs predetermined modulation on the signal received from the measurement instruction unit 34 and wirelessly transmits the modulated signal to the sensor substrate 20 via the antenna 31. The wireless communication unit 24 of the sensor substrate 20 demodulates a radio wave received from the measurement apparatus 30 and transmits the demodulated radio wave to the distance sensor 23.

Next, the measurement unit 35 receives a measurement value corresponding to the distance d from the distance sensor 23 to the focus ring 5 (S103). Specifically, the distance sensor 23 measures a physical amount (electrostatic capacitance in the present embodiment) corresponding to the distance from the distance sensor 23 to the focus ring 5 in response to the measurement instruction indicated by the signal received from the wireless communication unit 24 and transmits a signal indicating the measurement value to the wireless communication unit 24. The wireless communication unit 24 performs predetermined modulation on the signal indicating the measurement value which is received from the distance sensor 23 and wirelessly transmits the modulated signal to the measurement apparatus 30.

The wireless communication unit 32 of the measurement apparatus 30 receives the radio wave transmitted from the sensor substrate 20 via the antenna 31, demodulates the received radio wave, and transmits the demodulated radio wave to the acquisition unit 33. The acquisition unit 33 converts the signal demodulated by the wireless communication unit 32 to information on the measurement value and transmits the information to the measurement unit 35. The measurement unit 35 receives the information on the measurement value from the acquisition unit 33 and stores information on the distance d corresponding to the measurement value of the received information.

Next, the measurement unit 35 determines whether or not the number of measurement by the distance sensor 23 has reached a predetermined number (S104). If the number of measurement by the distance sensor 23 has not reached the predetermined number (S104: No), the measurement unit 35 transmits to the transfer instruction unit 36 an instruction to move the sensor substrate 20 by a predetermined distance along the transfer direction B. The transfer instruction unit 36 converts the instruction from the measurement unit 35 to a control signal and transmits the control signal to the transfer unit 110. The transfer unit 110 moves the sensor substrate 20 by a predetermined direction along the transfer direction B (S105). Then, the measurement unit 35 performs the processing of the step S102.

On the other hand, if the number of measurement by the distance sensor 23 has reached the predetermined number (S104: Yes), the measurement unit 35 transmits to the transfer instruction unit 36 an instruction to load the sensor substrate 20 to a position where the distance sensor is located at a portion above the focus ring 5 which is far from the gate valve G. The transfer instruction unit 36 convers the instruction from the measurement unit 35 to a control signal and transmits the control signal to the transfer unit 110. The transfer unit 110 loads the sensor substrate 20 to a position where the distance sensor is located at a portion above the focus ring 5 which is far from the gate valve G (S106).

Next, the measurement unit 35 transmits a measurement instruction (S107). Next, the measurement unit 35 receives a measurement value corresponding to the distance d from the distance sensor 23 to the focus ring 5 (S108). Then, the measurement unit 35 determines whether or not the number of measurement by the distance sensor 23 has reached a predetermined number (S109). If the number of measurement by the distance sensor 23 has not reached the predetermined number (S109: No), the measurement unit 35 transmits to the transfer instruction unit 36 an instruction to move the sensor substrate 20 by a predetermined direction along the transfer direction B (S110). Thereafter, the measurement unit 35 performs the processing of the step S107. The processing of the steps S107 to S110 is the same as that described in the steps S102 to S105. Therefore, the detailed description thereof will be omitted.

If the number of measurement by the distance sensor 23 has reached the predetermined number (S109: Yes), the measurement unit 35 transmits to the transfer instruction unit 36 an instruction to return the sensor substrate 20 to the cassette 130. The transfer instruction unit 36 converts the instruction from the measurement unit 35 to a control signal and transmits the control signal to the transfer unit 110. The transfer unit 110 accommodates the sensor substrate 20 in the cassette 130 (S111).

Next, the measurement unit 35 calculates the distance $d_0$ from the distance sensor 23 to the focus ring 5 in the initial state by obtaining an average of the distance d measured multiple times at the portion above the focus ring 5 which is close to the gate valve G and the distance d measured multiple times at the portion above the focus ring 5 which is far from the gate valve G (S112). Then, the measurement unit 35 stores the calculated distance $d_0$ in a memory of the measurement apparatus 30 (S113) and the initial state measurement process by the measurement apparatus 30 described in the flowchart is completed.

(Consumption Amount Measurement Process)

Figure 10:
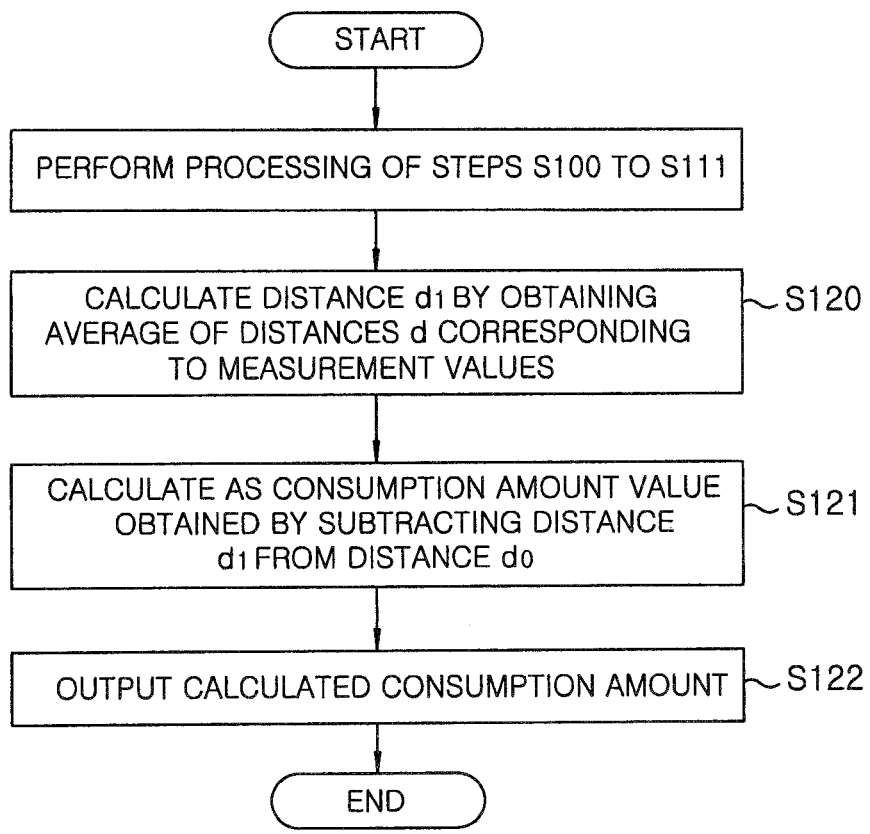
FIG. 10 is a flowchart showing an example of a process of measuring a consumption amount of the focus ring.

FIG. 10 is a flowchart showing an example of a process of measuring a consumption amount of the focus ring 5. For example, when the user of the processing system 100 instructs the consumption amount measurement process, the measurement apparatus 30 starts the processing described in the flowchart.

First, the sensor substrate 20 and the measurement apparatus 30 perform the processing of the steps S100 to S111 described in FIG. 9. Then, the measurement unit 35 calculates the distance $d_1$ from the distance sensor 23 to the focus ring 5 by obtaining an average of the distances d corresponding to values measured multiple times at the portion above the focus ring 5 which is close to the gate valve G and the distances d corresponding to values measured multiple times at the portion above the focus ring 5 which is far from the gate valve G (S120).

Next, the measurement unit 35 calculates, as the consumption amount of the focus ring 5, the value obtained by subtracting the distance $d_1$ calculated in the step S120 from the stored distance $d_0$ in the initial state (S121). Next, the measurement unit 35 outputs the calculated consumption amount of the focus ring 5 to the output device 38 such as a display or the like (S122), and the consumption amount measurement process by the measurement apparatus 30 described in the flowchart is completed.

(Hardware)

Figure 11:
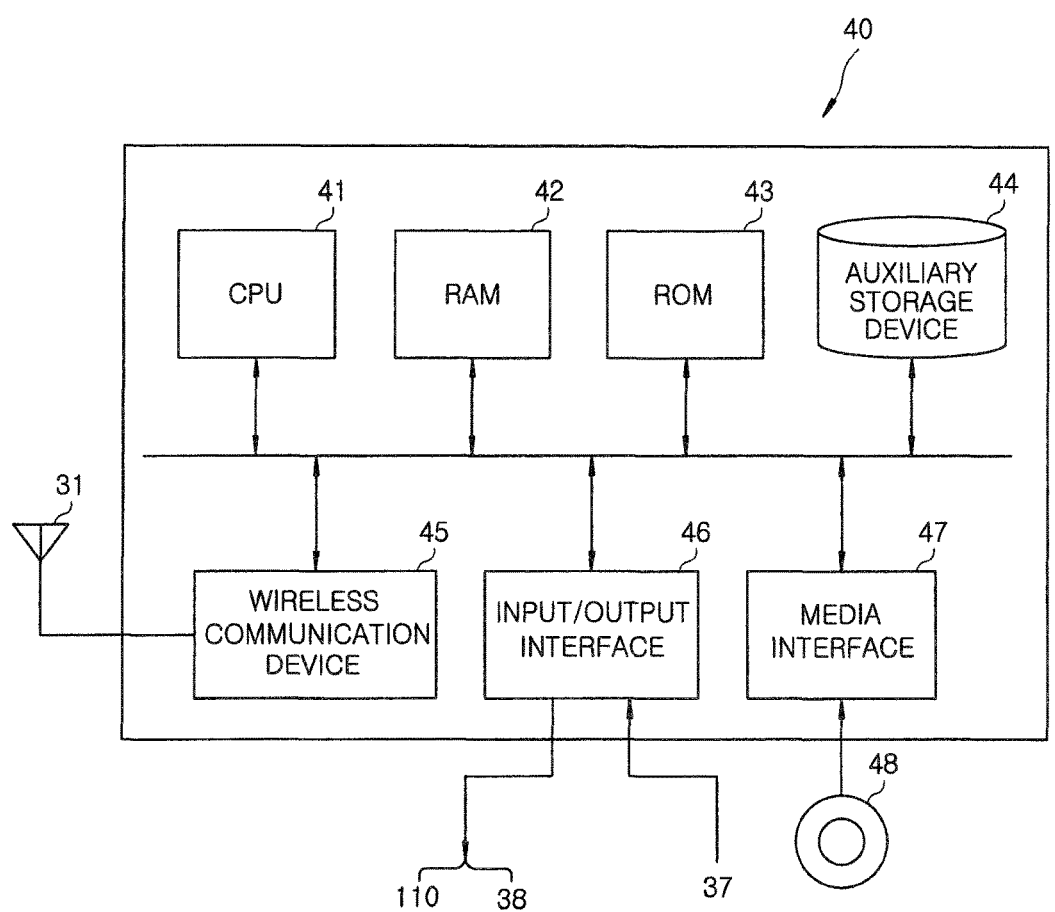
FIG. 11 shows an example of a computer for realizing a function of the measurement apparatus.

FIG. 11 shows an example of a computer 40 for realizing the function of the measurement apparatus 30. The computer 40 includes a CPU (Central Processing Unit) 41, a RAM (Random Access Memory) 42, a ROM (Read Only Memory) 43, an auxiliary storage device 44, a wireless communication device 45, an input/output interface (I/F) 46, and a media interface (I/F) 47.

The CPU 41 operates based on the program stored in the ROM 43 or the auxiliary storage device 44 and controls the respective components. The ROM 43 stores a boot program that is executed by the CPU 41 when the computer 40 is started, a program that depends on the hardware of the computer 40, and the like.

The auxiliary storage device 44 is, e.g., a HDD (Hard Disk Drive), a SSD (Solid State Drive), or the like. The auxiliary storage device 44 stores a program executed by the CPU 41, data used by the corresponding program, and the like. The wireless communication device 45 wirelessly communicates with the sensor substrate 20 or the like. The wireless communication device 45 receives data from another device such as the sensor substrate 20 or the like and transmits the received data to the CPU 41. Further, the wireless communication device 45 transmits data generated by the CPU 41 to another device such as the sensor substrate 20 or the like.

The CPU 41 controls the output device 38 such as a display, a printer and the like, the transfer unit 110, and the input device 37 such as a keyboard, a mouse and the like via the input/output interface 46. The CPU 41 acquires data from the input device 37 via the input/output interface 46. Further, the CPU 41 outputs generated data to the output device 38 or the transfer unit 110 via the input/output interface 46.

The media interface 47 reads out a program or data stored in the storage medium 48 and provides the program or the data to the CPU 41 via the RAM 42. The CPU 41 loads the program that is read out from the storage medium 48 via the media interface 47 on the RAM 42 and executes the loaded program. The storage medium 48 is, e.g., an optical recording medium such as a DVD (Digital Versatile Disc), a PD (Phase change rewritable Disk) or the like, a magneto-optical recording medium such as a MO (Magneto-Optical disk), a tape medium, a magnetic recording medium, a semiconductor memory, or the like.

The CPU 41 of the computer 40 realizes the functions of the wireless communication unit 32, the acquisition unit 33, the measurement instruction unit 34, the measurement unit 35 and the transfer instruction unit 36 by executing the program loaded on the RAM 42. The CPU 41 of the computer 40 reads out the program from the storage medium 48 and executes the program. However, in another example, the CPU 41 may acquire the program from another device through a wireless or wired communication line.

The processing system 100 according to the embodiment described above can measure the consumption amount of the focus ring 5, without modifying the conventional plasma etching apparatus 101, in a state where the inside of the processing chamber 1 is maintained in a depressurized state.

The disclosure is not limited to the above embodiment and may be variously modified within the gist of the disclosure.

Figure 12:
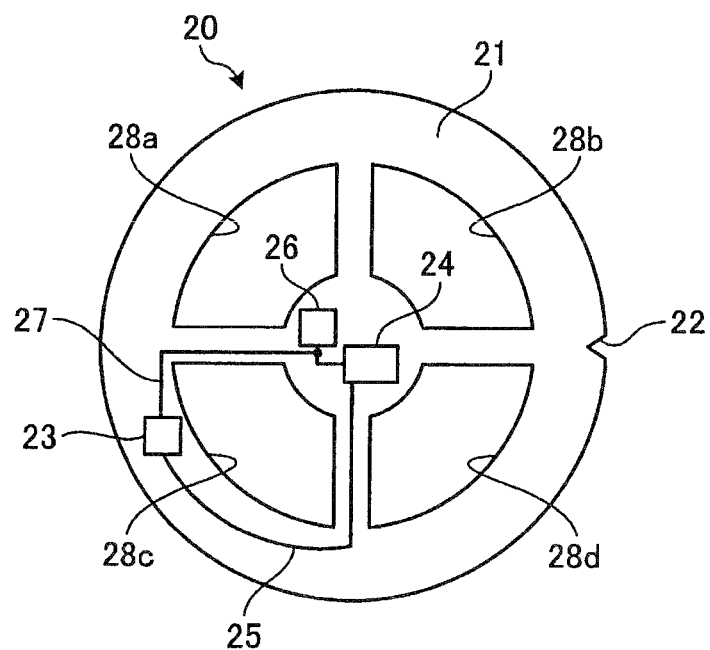
FIGS. 12 and 13 show other examples of the sensor substrate.

As shown in FIG. 12, for example, a plurality of openings 28a to 28d may be formed at the base substrate 21 of the sensor substrate 20. The sensor substrate 20 may be heavier than the semiconductor wafer W as a target substrate due to the installation of the distance sensor 23, the wireless communication unit 24 and the battery 26 on the base substrate 21. Therefore, when the arm of the transfer unit 110 is stretched to load the sensor substrate 20 into the processing chamber 1, the arm may be bent and the sensor substrate 20 may contact with the component of the processing chamber 1. Accordingly, the openings 28a to 28d are formed at the base substrate 21 as shown in FIG. 12, for example, so that the sensor substrate 20 becomes lighter and is prevented from contacting with the component of the processing chamber 1.

Figure 13:
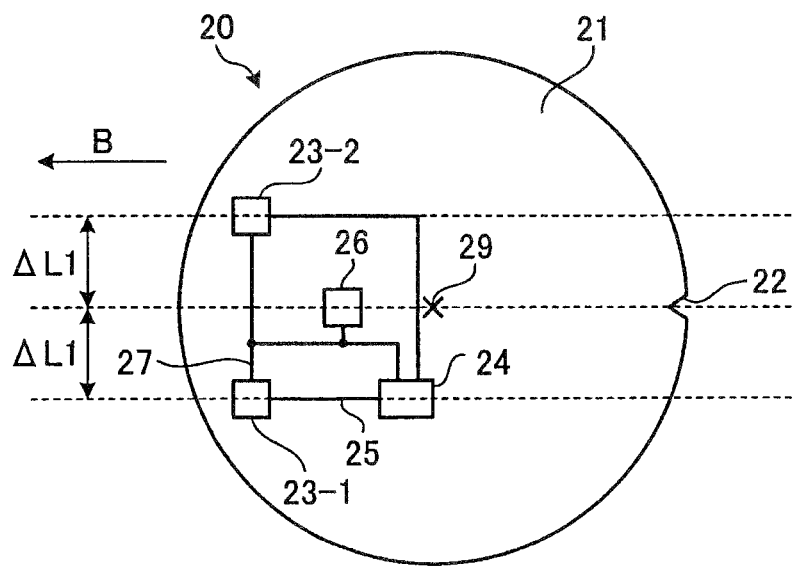

In the above embodiment, one distance sensor 23 is installed on the base substrate 21 of the sensor substrate 20. However, the disclosure is not limited thereto. As shown in FIG. 13, for example, a plurality of distance sensors 23-1 and 23-2 may be installed on the base substrate 21. This enables the consumption amount to be measured at larger number of portions of the focus ring 5. Accordingly, the consumption amount measurement accuracy can be improved. In that case, it is preferable that each of the distance sensors 23 is provided at a position on the base substrate 21 to be separated from the straight line passing through the center 29 of the base substrate 21 and the positioning portion 22 by a distance of $\Delta L1$, as can be seen from FIG. 13, for example.

In the above embodiment, the measurement apparatus 30 receives the signal indicating the measured physical amount corresponding to the distance from the sensor substrate 20 by wireless communication. However, the disclosure is not limited thereto. For example, the distance sensor 23 of the sensor substrate 20 may store the measured physical amount corresponding to the distance in a memory installed on the base substrate 21. The user of the processing system 100 unloads the sensor substrate 20 from the cassette chamber 103 after the measurement and connects the sensor substrate 20 to the measurement apparatus 30 via a cable or the like. The measurement apparatus 30 may read out the measurement value from the memory of the sensor substrate 20 via the cable or the like.

In the above embodiment, the transfer unit 110 loads the sensor substrate 20 into the processing chamber 1 along the transfer direction B of the semiconductor wafer W, and the distance sensor 23 measures a distance from the distance sensor 23 to the focus ring 5 when the distance sensor 23 passes through the space above the focus ring 5 during the loading of the sensor substrate 20. However, the disclosure is not limited thereto. For example, if the transfer unit 110 can move more freely, the transfer unit 110 may move the sensor substrate 20 loaded into the processing chamber 1 such that the distance sensor 23 moves above the focus ring 5 along the focus ring 5. Accordingly, the measurement apparatus 30 can measure the consumption amount at a larger number of portions of the focus ring 5. As a result, the consumption amount measurement accuracy is improved.

In the above embodiment, the base substrate 21 of the sensor substrate 20 has substantially the same shape as that of the semiconductor wafer W. However, the base substrate 21 may be larger than the semiconductor wafer W. In that case, it is preferable to install the distance sensor 23 at a position close to an outer periphery of the base substrate 21. Accordingly, the transfer unit 110 can move the distance sensor 23 to the portion above the focus ring 5 which is far from the gate valve G while moving the sensor substrate 20 within the same range as that in the case of loading the semiconductor wafer W as a target substrate into the processing chamber 1.

While the disclosure has been shown and described with respect to the embodiments, it will be understood by those skilled in the art that various changes and modifications may be made without departing from the scope of the disclosure as defined in the following claims.

What is claimed is:

1. A measurement system for measuring a consumption amount of a focus ring in a plasma etching apparatus including a processing chamber configured to accommodate a target substrate, a lower electrode provided in the processing chamber and configured to mount thereon the target substrate loaded into the processing chamber by a transfer unit, and the focus ring provided on a peripheral region of the lower electrode, the measurement system comprising:
    a sensor substrate having a distance sensor configured to measure information on a physical amount corresponding to a vertical distance from the distance sensor to the focus ring; and
    a measurement apparatus configured to measure a consumption amount of the focus ring, wherein the measurement apparatus includes:
    (i) a transfer instruction unit configured to instruct the transfer unit to transfer the sensor substrate into the processing chamber,
    (ii) an acquisition unit configured to acquire the information on the physical amount, and
    (iii) a measurement unit configured to measure the consumption amount of the focus ring based on the acquired information on the physical amount,
    wherein the sensor substrate has a positioning portion that is an orientation flat or a notch,
    wherein the distance sensor is located at a position on the sensor substrate which is separated by a predetermined distance from a straight line passing through the center of the sensor substrate and the positioning portion, and
    wherein the predetermined distance is in a range of ¼ to ½ of the radius of the sensor substrate.

2. The measurement system of claim 1, wherein the distance sensor measures the information on the physical amount at a plurality of positions of the focus ring while passing through a space above the focus ring in a horizontal direction.

3. The measurement system of claim 1, wherein the transfer instruction unit instructs the transfer unit to load the sensor substrate to a position which is farther from a gate through which the target substrate is loaded into the processing chamber than a position where the target substrate is mounted on the lower electrode, and
    the distance sensor measures the information on the physical amount at least at a first portion and a second portion of the focus ring, the first portion being placed between a center of the focus ring and the gate and the center of the focus ring being placed between the second portion and the first portion.

4. The measurement system of claim 1, wherein when the transfer unit loads the sensor substrate into the processing chamber, the transfer instruction unit instructs the transfer unit to hold the sensor substrate such that the distance sensor is located at the position on the sensor substrate which is separated by a predetermined distance from a straight line passing through the center of the sensor substrate and indicating a transfer direction of the sensor substrate.

5. The measurement system of claim 1, wherein the distance sensor is an electrostatic capacitance sensor and measures an electrostatic capacitance as the physical amount corresponding to the vertical distance from the distance sensor to the focus ring.

6. The measurement system of claim 1, wherein the sensor substrate includes a wireless communication device configured to wirelessly transmit the information on the physical amount, and
    the acquisition unit acquires the information on the physical amount-which is wirelessly transmitted by the wireless communication device.

7. A measurement method for measuring a consumption amount of a focus ring in a plasma etching apparatus including a processing chamber configured to accommodate a target substrate, a lower electrode provided in the processing chamber and configured to mount thereon the target substrate loaded into the processing chamber by a transfer unit, and the focus ring provided on a peripheral region of the lower electrode, the measurement method comprising:
    transferring a sensor substrate having a distance sensor into the processing chamber, the distance sensor being configured to measure information on a physical amount corresponding to a vertical distance from the distance sensor to the focus ring;
    acquiring the information on the physical amount; and
    measuring a consumption amount of the focus ring based on the acquired information on the physical amount,
    wherein the sensor substrate has a positioning portion that is an orientation flat or a notch, wherein the distance sensor is located at a position on the sensor substrate which is separated by a predetermined distance from a straight line passing through the center of the sensor substrate and the positioning portion, and wherein the predetermined distance is in a range of ¼ to ½ of the radius of the sensor substrate.

8. The measurement system of claim 1, wherein the measurement unit is configured to output an information indicating that the consumption amount of the focus ring has reached a threshold to an output device.

9. The measurement method of claim 7, further comprising outputting an information indicating that the consumption amount of the focus ring has reached a threshold to an output device.

10. A measurement system for measuring a consumption amount of a focus ring in a plasma etching apparatus including a processing chamber configured to accommodate a target substrate, a lower electrode provided in the processing chamber and configured to mount thereon the target substrate loaded into the processing chamber by a transfer unit, and the focus ring provided on a peripheral region of the lower electrode, the measurement system comprising:

a sensor substrate having a distance sensor configured to measure information on a physical amount corresponding to a vertical distance from the distance sensor to the focus ring; and a measurement apparatus configured to measure a consumption amount of the focus ring, wherein the measurement apparatus includes:

(i) a transfer instruction unit configured to instruct the transfer unit to transfer the sensor substrate into the processing chamber, (ii) an acquisition unit configured to acquire the information on the physical amount, and (iii) a measurement unit configured to measure the consumption amount of the focus ring based on the acquired information on the physical amount, wherein the sensor substrate has a positioning portion that is an orientation flat or a notch, wherein the distance sensor is located at a position on the sensor substrate which is separated by a predetermined distance from a straight line passing through the center of the sensor substrate and the positioning portion, and wherein a plurality of openings are formed at the sensor substrate.

11. The measurement method of claim 7, wherein a plurality of openings are formed at the sensor substrate.

* * * * *